(12) United States Patent
Chang et al.

(10) Patent No.: US 11,107,897 B2
(45) Date of Patent: Aug. 31, 2021

(54) METHODS OF FORMING SEMICONDUCTOR DEVICES AND FINFET DEVICES HAVING SHIELDING LAYERS

(71) Applicant: Taiwan Semiconductor Manufacturing Co., Ltd., Hsinchu (TW)

(72) Inventors: Che-Hao Chang, Hsinchu (TW); Cheng-Hao Hou, Hsinchu (TW); Kuei-Lun Lin, Keelung (TW); Kun-Yu Lee, Tainan (TW); Xiong-Fei Yu, Hsinchu (TW); Chi-On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 4 days.

(21) Appl. No.: 16/524,137

(22) Filed: Jul. 28, 2019

(65) Prior Publication Data

US 2021/0028285 A1    Jan. 28, 2021

Related U.S. Application Data

(62) Division of application No. 15/876,223, filed on Jan. 22, 2018, now Pat. No. 10,367,078.

(Continued)

(51) Int. Cl.
*H01L 29/40* (2006.01)
*H01L 29/66* (2006.01)
*H01L 29/78* (2006.01)
*H01L 21/02* (2006.01)
*H01L 29/51* (2006.01)

(Continued)

(52) U.S. Cl.
CPC ...... *H01L 29/401* (2013.01); *H01L 21/02178* (2013.01); *H01L 29/408* (2013.01); *H01L 29/513* (2013.01); *H01L 29/66545* (2013.01); *H01L 29/66795* (2013.01); *H01L 29/785* (2013.01); *H01L 21/02205* (2013.01); *H01L 21/28088* (2013.01); *H01L 21/28194* (2013.01);

(Continued)

(58) Field of Classification Search
CPC ................. H01L 29/401; H01L 29/513; H01L 29/66545; H01L 29/66795; H01L 29/408; H01L 21/02178; H01L 29/785; H01L 21/02205; H01L 21/28088; H01L 21/28194; H01L 29/518; H01L 29/4966; H01L 29/517
See application file for complete search history.

(56) References Cited

U.S. PATENT DOCUMENTS

2012/0070953 A1\* 3/2012 Yu ..................... H01L 29/66803
                                                            438/301
2015/0348850 A1\* 12/2015 Lee .......................... G03F 1/00
                                                            438/587

(Continued)

*Primary Examiner* — Edward Chin
(74) *Attorney, Agent, or Firm* — JCIPRNET

(57) ABSTRACT

Semiconductor devices, FinFET devices and methods of forming the same are disclosed. One of the semiconductor devices includes a substrate and a gate structure over the substrate. The gate structure includes a high-k layer over the substrate, a shielding layer over the high-k layer, and an N-type work function metal layer over the shielding layer. In some embodiments, the shielding layer has a dielectric constant less than a dielectric constant of the high-k layer.

19 Claims, 5 Drawing Sheets

Related U.S. Application Data

(60) Provisional application No. 62/584,085, filed on Nov. 9, 2017.

(51) Int. Cl.
*H01L 29/49* (2006.01)
*H01L 21/28* (2006.01)

(52) U.S. Cl.
CPC ........ *H01L 29/4966* (2013.01); *H01L 29/517* (2013.01); *H01L 29/518* (2013.01)

(56) References Cited

U.S. PATENT DOCUMENTS

2017/0005003 A1\* 1/2017 Ando ................. H01L 21/28194
2019/0140082 A1\* 5/2019 Chang .................. H01L 29/785

\* cited by examiner

METHODS OF FORMING SEMICONDUCTOR DEVICES AND FINFET DEVICES HAVING SHIELDING LAYERS

CROSS-REFERENCE TO RELATED APPLICATION

This application is a divisional application of and claims the priority benefit of a prior application Ser. No. 15/876,223, filed on Jan. 22, 2018. The prior application Ser. No. 15/876,223 claims the priority benefits of U.S. provisional application Ser. No. 62/584,085, filed on Nov. 9, 2017. The entirety of each of the above-mentioned patent applications is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of manufacturing ICs and, for these advances to be realized, similar developments in IC manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
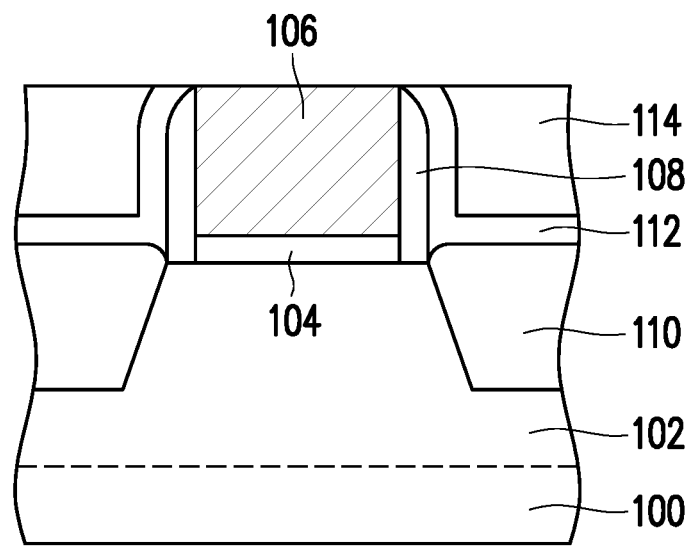
FIG. 1A to FIG. 1E are schematic perspective views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on" "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1E are schematic perspective views of a method of forming a FinFET device in accordance with some embodiments.

Referring to FIG. 1A, a substrate 100 with at least one fin 102 is provided. In some embodiments, the substrate 100 includes a silicon substrate, a silicon-on-insulator (SOI) substrate, a silicon germanium substrate, or a suitable semiconductor substrate. Other semiconductor materials including group III, group IV, and group V elements may also be used. In some embodiments, the substrate 100 has an isolation layer formed thereon. Specifically, the isolation layer covers the lower portion while exposes the upper portion of the fin 102. In some embodiments, the isolation layer is a shallow trench isolation (STI) structure. In some embodiments, the substrate 100 and the fin 102 are made by the same material. In alternative embodiments, the substrate 100 includes a material different from that of the fin 102.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, the substrate 100 further has a dummy gate 106 formed across the fin 102, spacers 108 formed on sidewalls of the dummy gate 106, strained layers 110 formed in the fin 102 beside the dummy gate 106, and a dielectric layer 114 formed aside the dummy gate 106 and over the strained layers 110.

In some embodiments, the fin 102 extends in a first direction, and the dummy gate 106 extends in a second direction different from (e.g., perpendicular to) the first direction. In some embodiments, the dummy gate 106 includes a silicon-containing material, such as polysilicon, amorphous silicon or a combination thereof. In some embodiments, an interfacial layer 104 is formed between the dummy gate 106 and the fin 102, and the interfacial layer 104 includes silicon oxide, silicon oxynitride or a combination thereof.

In some embodiments, the spacers 108 have a dielectric constant less than about 10, less than about 7 or even less than about 5. In some embodiments, the spacers 108 include a nitrogen-containing dielectric material, a carbon-containing dielectric material or both. In some embodiments, the spacers 108 includes SiN, SiCN, SiOCN, SiOR (wherein R is an alkyl group such as $CH_3$, $C_2H_5$ or $C_3H_7$), SiC, SiOC, SiON, a combination thereof or the like. In some embodiments, the method of forming the spacers 108 includes forming a spacer material layer on the substrate 100, and partially removing the spacer material layer by an anisotropic etching process.

In some embodiments, the strained layers 110 include silicon carbon (SiC), silicon phosphate (SiP), SiCP or a SiC/SiP multi-layer structure for an N-type FinFET device. In some embodiments, the strained layers 110 may be optionally implanted with an N-type dopant as needed. In some embodiments, the method of forming the strained layers 110 includes forming recesses in the fin 102, and growing epitaxy layers from the recesses. In some embodiments, the strained layers 110 can be referred to as "source/drain regions". In some embodiments, following the formation of the strained layers 110, silicide layers are formed by siliciding the top portions of the strained layers 110.

In some embodiments, the dielectric layer 114 includes nitride such as silicon nitride, oxide such as silicon oxide, phosphosilicate glass (PSG), borosilicate glass (BSG), boron-doped phosphosilicate glass (BPSG), a combination thereof or the like, and is formed by a suitable deposition technique such as spin-coating, CVD, flowable CVD, PECVD, ALD, a combination thereof or the like. In some embodiments, an etch stop layer 112 is formed before the formation of the dielectric layer 114 and after the formation of the strained layers 110. In some embodiments, the etch stop layer 112 includes SiN, SiC, SiCN, SiON, SiCON, a combination thereof or the like. In some embodiments, an etch stop material layer and a dielectric material layer are formed over the substrate 100 covering the dummy gate 106, and then planarized by a suitable technique such as CMP until the top of the dummy gate 106 is exposed. In some embodiments, the top surfaces of the dielectric layer 114 and the etching stop layer 112 are substantially level with the top surface of the dummy gate 106.

Figure 1B:
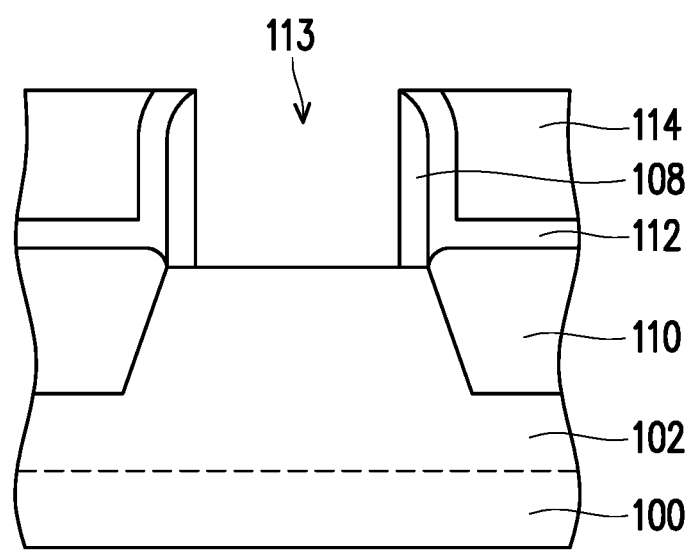

Referring to FIG. 1B, the dummy gate 106 is removed to form a trench 113 in the dielectric layer 114. In some embodiments, the interfacial layer 104 is simultaneously removed during the removal of the dummy gate 106. The removing operation includes performing a suitable etching process, such as a dry etching, a wet etching or both.

Figure 1C:
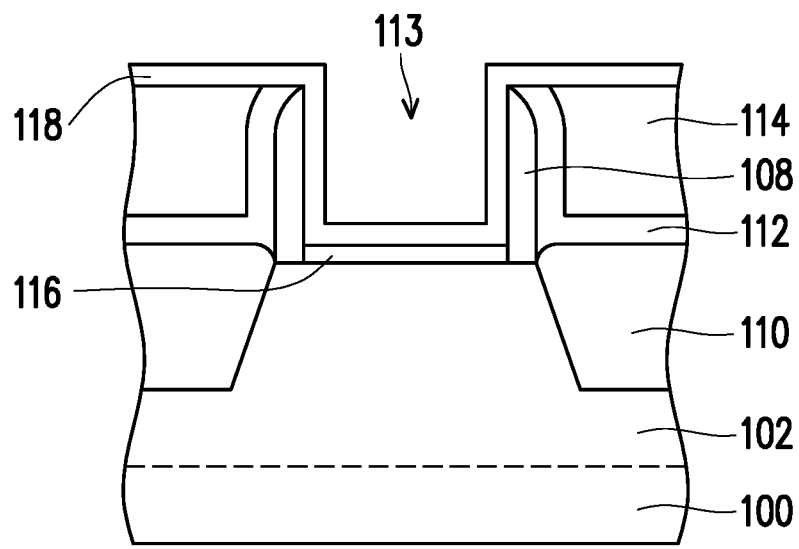

Referring to FIG. 1C, an initial layer 116 is formed on the surface of the fin 102. In some embodiments, the initial layer 116 has a dielectric constant less than about 8, less than about 6 or even less than about 4. In some embodiments, the initial layer 116 includes silicon oxide, silicon oxynitride, a combination thereof or the like. In some embodiments, when the initial layer 116 is formed by using thermal oxidation, ozone oxidation or a suitable oxidation process, the initial layer 116 is formed on the bottom surface of the trench 113. In alternative embodiments, when the initial layer 116 is formed by using CVD, ALD or a suitable deposition process, the initial layer 116 is formed on the entire surface (e.g., side and bottom surfaces) of the trench 113.

Thereafter, a high-k layer 118 is formed over the substrate 100 and fills in the trench 113. In some embodiments, the high-k layer 118 is conformally formed on the top surface of the dielectric layer 114, the top surface of the initial layer 116 and the sidewall of the trench 113. In some embodiments, the high-k layer 118 has a dielectric constant greater than that of the initial layer 116. For example, the high-k layer 118 has a dielectric constant greater than about 12, greater than about 16 or even greater than about 20.

In some embodiments, the high-k layer 118 includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, the high-k layer 118 can optionally include a silicate such as HfSiO, HfSiON LaSiO, AlSiO, a combination thereof, or a suitable material. In some embodiments, the method of forming the high-k layer 118 includes performing at least one suitable deposition technique, such as CVD, PECVD, metal oxide chemical vapor deposition (MOCVD), ALD, RPALD, PEALD, MBD or the like.

Figure 1D:
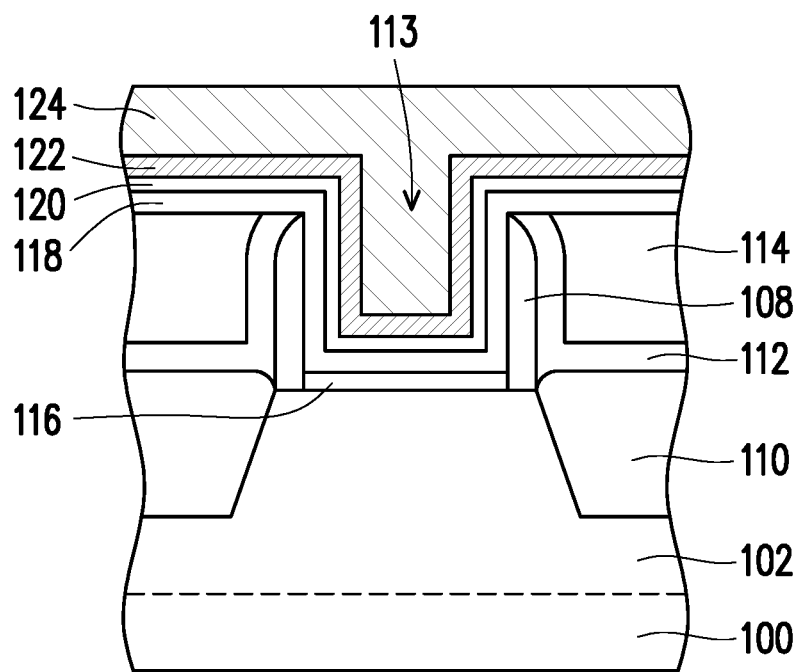

Referring to FIG. 1D, a shielding layer 120 is formed over the substrate 100 and fills in the trench 113. In some embodiments, the shielding layer 120 is conformally formed on the high-k layer 118. In some embodiments, the shielding layer 120 is formed directly on the high-k layer 118.

In some embodiments, the dielectric constant of the shielding layer 120 is lower than the dielectric constant of the high-k layer 118 while higher than the dielectric constant of the initial layer 116. For example, the shielding layer 120 has a dielectric constant from about 4 to 10. In some embodiments, the dielectric constant of the shielding layer 120 can be, for example but is not limited to, about 4.0, 4.5, 5.0, 5.5, 6.0, 6.5, 7.0, 7.5, 8.0, 8.5, 9.0, 9.5, 10.0, including any range between any two of the preceding values.

In some embodiments, the shielding layer 120 includes aluminum oxide ($Al_2O_3$), aluminum nitride (AlN) or a combination thereof. In some embodiments, the method of forming the shielding layer 120 includes performing at least one suitable deposition technique, such as CVD, PECVD, metal oxide chemical vapor deposition (MOCVD), ALD, RPALD, PEALD, MBD or the like.

In some embodiments, the thickness ratio of the high-k layer 118 to the shielding layer 120 is from about 5 to 20. For example, the high-k layer 118 may have a thickness ranging from about 5 angstroms to 20 angstroms, such as from about 10 angstroms to 15 angstroms, and the shielding layer 120 may have a thickness ranging from about 1 angstroms to about 5 angstrom, such as from about 2 angstroms to 3 angstroms.

In some embodiments, the shielding layer 120 and the high-k layer 118 exhibit different states. In some embodiments, the shielding layer 120 is formed in an amorphous state. In some embodiments, the high-k layer 118 is formed in a fully crystalline state. In alternative embodiments, the high-k layer 118 is formed in a partially crystalline state; that is, the high-k layer 118 is formed in a mixed crystalline-amorphous state and having some degree of structural order.

Continue referring to FIG. 1D, an N-type work function metal layer 122 is formed over the substrate 100 and fills in the trench 113. In some embodiments, the N-type work function metal layer 122 is conformally formed on the shielding layer 120.

In some embodiments, the N-type work function metal layer 122 is formed directly on the shielding layer 120.

In some embodiments, the N-type work function metal layer 122 includes TiAl, TiAlC, TiAlC, TaAl, TaAlN, TaAlC or a combination thereof. In some embodiments, the method of forming the N-type work function metal layer 122 includes performing at least one suitable deposition technique, such as CVD, PECVD, ALD, RPALD, PEALD, MBD or the like.

The shielding layer 120 and one of the high-k layer 118 and the N-type work function metal layer 122 are formed in the same chamber. In some embodiments, the shielding layer 120 and the high-k layer 118 are formed in the same process chamber. For example, the high-k layer 118 is deposited on the substrate 100 by pulsing a high-k precursor and an oxygen-containing precursor into a process chamber, and the shielding layer 120 is then immediately deposited on the high-k layer 118 by pulsing an aluminum precursor (e.g., $Al(CH_3)_3$) and an oxygen-containing precursor (e.g., $H_2O$, $O_2$ or $O_3$ or the like) or a nitrogen-containing precursor (e.g., $NH_3$, $N_2H_4$, $Na_2H$ or the like) into the same process chamber.

In some embodiments, the shielding layer 120 and the N-type work function metal layer 122 are formed in the same process chamber. For example, the shielding layer 120 is deposited on the high-k layer 118 by pulsing an aluminum precursor (e.g., $Al(CH_3)_3$) and an oxygen-containing precursor (e.g., $H_2O$, $O_2$ or $O_3$ or the like) or a nitrogen-containing precursor (e.g., $NH_3$, $N_2H_4$, $Na_2H$ or the like) into a process chamber, and the N-type work function metal layer 122 is then immediately deposited on the shielding layer 120 by pulsing an aluminum precursor and a titanium precursor or a tantalum precursor into the same process chamber.

Afterwards, a metal filling layer 124 is formed over the substrate 100 and fills in the trench 113. The metal filling layer 124 can be configured to provide an electrical transmission. In some embodiments, the metal filling layer 124 is formed on the N-type work function metal layer 122 and completely fills the trench 113. In some embodiments, the metal filling layer 124 is formed directly on the N-type work function metal layer 122. In some embodiments, the metal filling layer 124 includes W, Al, Cu, a combination thereof or the like. In some embodiments, the method of forming the metal filling layer 124 includes performing at least one suitable deposition technique, such as CVD, PECVD, ALD, RPALD, PEALD, MBD or the like.

Figure 1E:
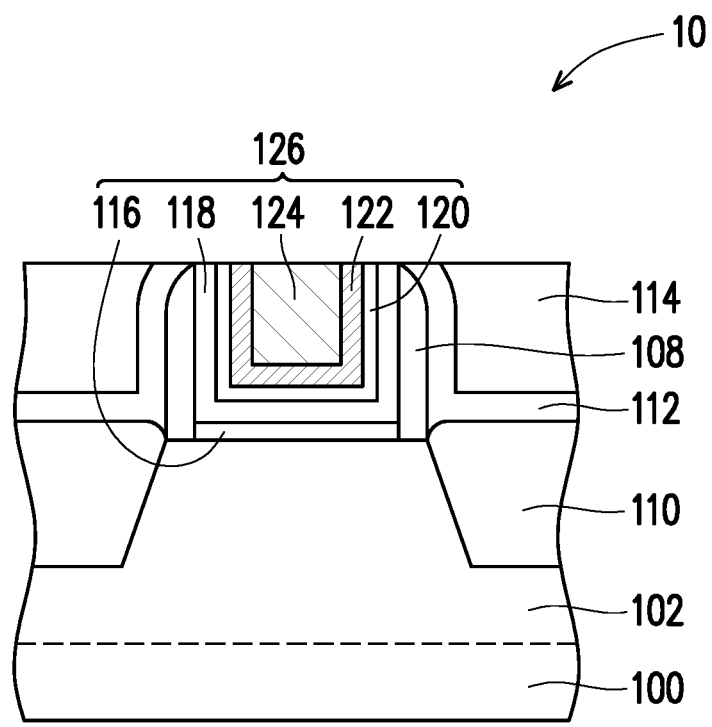

Referring to FIG. 1E, excess layers outside the trench 113 are removed, and the remaining layers form a gate structure 126 in the trench 113. In some embodiments, portions of the metal filling layer 124, the N-type work function metal layer 122, the shielding layer 120 and the high-k layer 118 outside the trench 113 are removed by a planarization operation such as CMP, and the remaining metal filling layer 124, the N-type work function metal layer 122, the shielding layer 120 and the high-k layer 118 and the initial layer 116 constitute the gate structure 126. A FinFET device 10 is thus completed.

In some embodiments, in the FinFET device 10, the shielding layer 120 is formed in a phase-stable amorphous state, so as to prevent a leakage current from passing along grain boundaries and therefore prevent the underlying elements from being damaged. Herein, the shielding layer 120 in an amorphous state is referred to as an amorphous shielding layer through the description of the disclosure.

Figure 2:
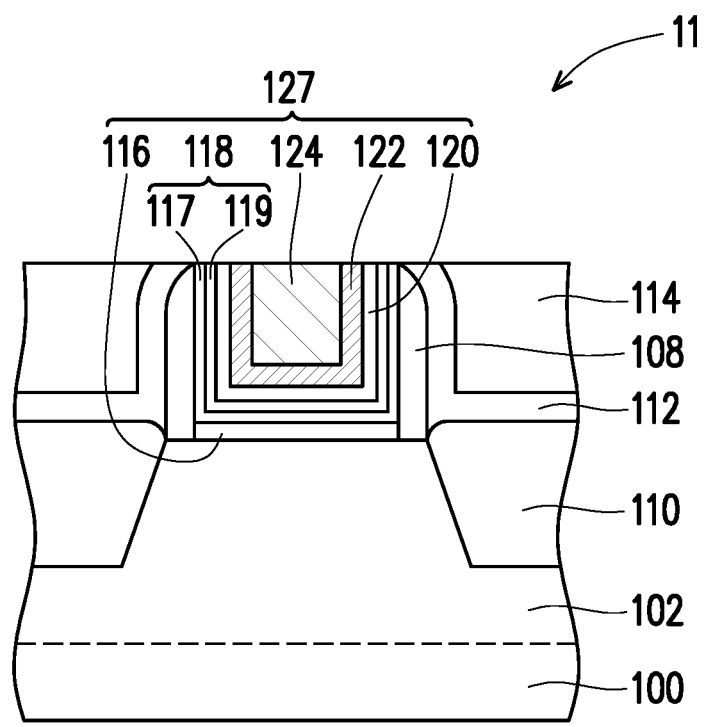
FIG. 2 is a cross-sectional view of a FinFET device in accordance with alternative embodiments.
Figure 3:
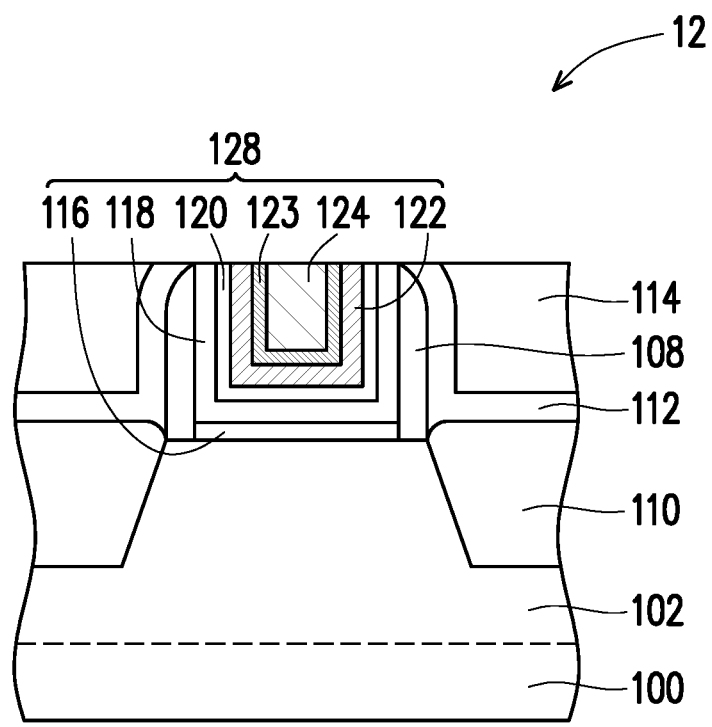
FIG. 3 is a cross-sectional view of a FinFET device in accordance with yet alternative embodiments.

Possible modifications and alterations can be made to the FinFET device. These modifications and alterations are provided for illustration purposes, and are not construed as limiting the present disclosure. FIG. 2 to FIG. 3 are cross-sectional views of FinFET devices in accordance with alternative embodiments.

The FinFET device 11 of FIG. 2 is similar to the FinFET device 10 of FIG. 1E, and the difference between them lies in that, the high-k layer 118 of the FinFET device 10 is a single layer, while the high-k layer 118 of the FinFET device 11 is a multi-layer structure. In some embodiments, as shown in FIG. 11, the high-k layer 118 includes a lower high-k layer 117 and an upper high-k layer 119, and the dielectric constant of the lower high-k layer 117 is between the dielectric constant of the initial layer 116 and the dielectric constant of the upper high-k layer 119. For example, the dielectric constant of the initial layer 116 is lower than about 8, the dielectric constant of the lower high-k layer is greater than about 12, and the dielectric constant of the upper high-k layer is greater than about 16.

The FinFET device 12 of FIG. 3 is similar to the FinFET device 10 of FIG. 1E, and the difference between them lies in that, the gate structure 126 of the FinFET device 10 is free of titanium nitride, while the gate structure 128 of the FinFET device 10 includes titanium nitride therein. In some embodiments, the gate structure 128 of the FinFET device 12 further includes a metal barrier layer 123 between the N-type work function metal layer 122 and the metal filling layer 124, and the metal barrier layer 123 includes titanium nitride.

The structures of the disclosure are described with reference to FIG. 1E, FIG. 2 and FIG. 3 in the following. In some embodiments, as shown in FIG. 1E, FIG. 2 and FIG. 3, a semiconductor device such as a FinFET device 10/11/12 includes a substrate 100 and a gate structure 126/127/128 over the substrate 100. In some embodiments, the substrate 100 has at least one fin 102 extending in a first direction, and the gate structure 126/127/128 is across the at least one fin 102 and extends in a second direction different from the first direction.

In some embodiments, the gate structure 126/127/128 includes a high-k layer 118 over the substrate 100, a shielding layer 120 over the high-k layer 118, and an N-type work function metal layer 122 over the shielding layer 120. In some embodiments, the high-k layer 118 is a single layer. In alternative embodiments, the high-k layer 118 has multi-layer structure including a lower high-k layer 117 and an upper high-k layer 119. In some embodiments, the dielectric constant of the shielding layer 120 is less than the dielectric constant (e.g., effective dielectric constant) of the high-k layer 118. For example, the shielding layer 120 has a dielectric constant from about 4 to 10, and the high-k layer has a dielectric constant greater than about 12. In some embodiments, the shielding layer 120 includes aluminum oxide, aluminum nitride or a combination thereof, and the N-type work function metal layer 122 includes TiAl, TiAlC, TiAlC, TaAl, TaAlN, TaAlC or a combination thereof. In some embodiments, the shielding layer 120 (e.g., aluminum oxide layer) is between and in physical contact with the high-k layer 118 and the N-type work function metal layer 122.

In some embodiments, the high-k layer 118 is in a crystalline state, and the shielding layer 120 is in an amorphous state. The amorphous shielding layer 120 prevents a leakage current from passing along grain boundaries and therefore prevent the underlying elements from being damaged.

In some embodiments, the gate structure 126/127/128 further includes an initial layer 116 between the fin 102 and the high-k layer 118, and the initial layer 116 includes silicon oxide, silicon oxynitride or a combination thereof. In some embodiments, the gate structure 126/127/128 further includes a metal filling layer 124 over the N-type work function metal layer 122, and the metal filling layer 124 includes W, Al, Cu or a combination thereof.

In some embodiments, the gate structure 126/127 is free of titanium nitride. That is, by disposing the shielding layer 120 of disclosure, the conventional TiN barrier layer between the high-k layer and the N-type work function metal layer is not required. In some embodiments, the gate structure 126/127 is free of tantalum nitride. That is, by disposing the shielding layer 120 of disclosure, the conventional TaN etch stop layer between the conventional TiN barrier layer and the N-type work function metal layer is not required.

In alternative embodiments, the gate structure 128 further includes titanium nitride as needed. For example, the gate structure 128 further includes a metal barrier layer 123 between the N-type work function metal layer 122 and the metal filling layer 124, and the metal barrier layer 123 includes TiN. In yet alternative embodiments, the gate structure 128 can further include a tantalum nitride layer as an etch stop layer upon the process requirements.

In the above embodiments, the method of the disclosure is applied to a FinFET device. However, the disclosure is not limited thereto. In alternative embodiments, the contact structure of the disclosure can be applied to a planar device upon the process requirements. Specifically, a planar substrate without fins is provided instead of the substrate 100 with fins 102, and such planar substrate is subjected to the process operations similar to those described in FIG. 1A to FIG. 1E, so as to fabricate a planar device with a shielding layer between a high-k layer and an N-type work function metal layer.

In view of the above, in some embodiments, a shielding layer is introduced between a high-k layer and an N-type work function metal layer, so as to protect the underlying layers from aluminum penetration which comes from the N-type work function metal layer. By disposing the shielding layer of the disclosure, the operations of forming the conventional capping layers (e.g., TiN and TaN layers) over the high-k layer can be omitted. A work function metal layer with a less aluminum content can be used for an N-type FinFET device due to the short distance from the work function metal to the channel, and thus, it is easier to achieve the conduction band edge for an extreme low Vt device. Besides, a gap-fill window for the work function metal layer can be relaxed due to skipping the conventional capping layers. The short-channel effect or weak-corner turn-on (WCTO) effect can be improved because the work function metal is closer to the channel, and thus, better device performance and reliability and less leakage penalty can be obtained.

In accordance with some embodiments of the present disclosure, a semiconductor device includes a substrate and a gate structure over the substrate. The gate structure includes a high-k layer over the substrate, a shielding layer over the high-k layer, and an N-type work function metal layer over the shielding layer. In some embodiments, the shielding layer has a dielectric constant less than that of the high-k layer.

In accordance with alternative embodiments of the present disclosure, a FinFET device includes a substrate having at least one fin and a gate structure across the at least one fin. The gate structure includes a high-k layer over the at least one fin, an N-type work function metal layer over the high-k layer, and an aluminum oxide layer between and in physical contact with the high-k layer and the N-type work function metal layer.

In accordance with yet alternative embodiments of the present disclosure, a method of forming a FinFET device including the following operations. A substrate is provided with at least one fin, a dummy gate across the at least one fin, and a dielectric layer aside the dummy gate. The dummy gate is removed to form a trench in the dielectric layer. A high-k layer is formed on a surface of the trench. A shielding layer is formed on the high-k layer, and a dielectric constant of the shielding layer is lower than a dielectric constant of the high-k layer. An N-type work function metal layer is formed on the shielding layer. In some embodiments, the shielding layer and one of the high-k layer and the N-type work function metal layer are formed in the same chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a substrate with a dummy gate and a dielectric layer aside the dummy gate;
   removing the dummy gate to form a trench in the dielectric layer;
   forming a high-k layer on a surface of the trench, wherein the high-k layer is formed in a crystalline state;
   introducing an aluminum precursor and an oxygen-containing precursor or an aluminum precursor and a nitrogen-containing precursor into a process chamber to form a shielding layer on the high-k layer, wherein the shielding layer is formed in an amorphous state; and
   forming an N-type work function metal layer on the shielding layer.

2. The method of claim 1, wherein the substrate has at least one fin extending in a first direction, and the dummy gate is across the at least one fin and extends in a second direction different from the first direction.

3. The method of claim 1, wherein the substrate is a planar substrate.

4. The method of claim 1, wherein the aluminum precursor comprises $Al(CH_3)_3$, the oxygen-containing precursor comprises $H_2O$, $O_2$ or $O_3$ or a combination thereof, and the nitrogen-containing precursor comprises $NH_3$, $N_2H_4$, $N_2H_2$ or a combination thereof.

5. The method of claim 1, wherein the shielding layer has a dielectric constant from about 4 to 10.

6. The method of claim 1, wherein the high-k layer has a dielectric constant greater than about 12.

7. The method of claim 1, wherein titanium nitride is not formed before forming the N-type work function metal layer.

8. The method of claim 1, wherein titanium nitride is immediately formed before forming the N-type work function metal layer.

9. A method of forming a FinFET device, comprising:
   providing a substrate with at least one fin, a dummy gate across the at least one fin, and a dielectric layer aside the dummy gate;
   removing the dummy gate to form a trench in the dielectric layer;
   forming a high-k layer on a surface of the trench;
   introducing an aluminum precursor and an oxygen-containing precursor into a process chamber to form a shielding layer on the high-k layer; and forming an N-type work function metal layer on the shielding layer.

10. The method of claim 9, wherein the aluminum precursor comprises $Al(CH_3)_3$, the oxygen-containing precursor comprises $H_2O$, $O_2$ or $O_3$ or a combination thereof.

11. The method of claim 9, further comprising forming a metal filling layer over the N-type work function metal layer.

12. The method of claim 11, further comprising forming a metal barrier layer between the N-type work function metal layer and the metal filling layer.

13. The method of claim 9, further comprising forming an oxide layer between the high-k layer and the at least one fin.

14. The method of claim 13, wherein the high-k layer comprises a lower high-k layer and an upper high-k layer, and a dielectric constant of the lower high-k layer is between a dielectric constant of the oxide layer and a dielectric constant of the upper high-k layer.

15. A method of forming a FinFET device, comprising:
providing a substrate with at least one fin, a dummy gate across the at least one fin, and a dielectric layer aside the dummy gate;
removing the dummy gate to form a trench in the dielectric layer;
forming a high-k layer on a surface of the trench;
introducing an aluminum precursor and an oxygen-containing precursor or an aluminum precursor and a nitrogen-containing precursor into a process chamber to forming a shielding layer on the high-k layer, wherein a dielectric constant of the shielding layer is lower than a dielectric constant of the high-k layer; and
forming an N-type work function metal layer on the shielding layer.

16. The method of claim 15, wherein the shielding layer and one of the high-k layer and the N-type work function metal layer are formed in the same chamber.

17. The method of claim 15, wherein the shielding layer comprises aluminum oxide, aluminum nitride or a combination thereof.

18. The method of claim 15, wherein the shielding layer is formed directly on the high-k layer.

19. The method of claim 15, wherein the N-type work function metal layer is formed directly on the shielding layer.

* * * * *